(12) United States Patent
Fujino

(10) Patent No.: US 11,769,805 B2
(45) Date of Patent: Sep. 26, 2023

(54) SEMICONDUCTOR DEVICE WITH FIELD PLATE ELECTRODE

(71) Applicants: Kabushiki Kaisha Toshiba, Tokyo (JP); Toshiba Electronic Devices & Storage Corporation, Tokyo (JP)

(72) Inventor: Yuhki Fujino, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/591,420

(22) Filed: Feb. 2, 2022

(65) Prior Publication Data

US 2022/0157952 A1 May 19, 2022

Related U.S. Application Data

(63) Continuation of application No. 17/004,545, filed on Aug. 27, 2020, now Pat. No. 11,282,929.

(30) Foreign Application Priority Data

Mar. 17, 2020 (JP) ................................. 2020-046909

(51) Int. Cl.
*H01L 29/40* (2006.01)
*H01L 29/78* (2006.01)
(Continued)

(52) U.S. Cl.
CPC .......... *H01L 29/407* (2013.01); *H01L 29/401* (2013.01); *H01L 29/42368* (2013.01);
(Continued)

(58) Field of Classification Search
CPC ................. H01L 29/407; H01L 29/401; H01L 29/42368; H01L 29/512; H01L 29/513;
(Continued)

(56) References Cited

U.S. PATENT DOCUMENTS 7,361,555 B2   4/2008   Koops et al.
8,541,834 B2   9/2013   Nozu
(Continued)

FOREIGN PATENT DOCUMENTS

JP   2007-528598 A   10/2007
JP   2012-204529 A   10/2012
(Continued)

OTHER PUBLICATIONS

Kenya Kobayashi et al., "100-V Class Two-step-oxide Field-Plate Trench MOSFET to Achieve Optimum RESURF Effect and Ultralow On-resistance," Proceedings of the 31st International Symposium on Power Semiconductor Devices & ICs 2019, pp. 99-102.

*Primary Examiner* — Douglas W Owens
(74) *Attorney, Agent, or Firm* — Allen & Overy LLP

(57) ABSTRACT

A semiconductor device includes: a first insulating film provided in a trench reaching a second semiconductor layer from above the second semiconductor region; a second electrode provided in the trench, the second electrode facing the second semiconductor layer via the first insulating film; the second insulating film being provided between the side surface of the second electrode and a fifth insulating film provided between a side surface of the second electrode and the second semiconductor layer, the second insulating film containing a second insulating material having a higher dielectric constant than the first insulating material; a third electrode provided above the second electrode, the first insulating film and the second insulating film, the third electrode facing the first semiconductor region; an interlayer insulating film provided on the third electrode; and a fourth electrode provided above the interlayer insulating film.

20 Claims, 16 Drawing Sheets

(51) Int. Cl.
*H01L 29/423* (2006.01)
*H01L 29/51* (2006.01)
*H01L 29/417* (2006.01)

(52) U.S. Cl.
CPC .......... *H01L 29/512* (2013.01); *H01L 29/513* (2013.01); *H01L 29/518* (2013.01); *H01L 29/7813* (2013.01); *H01L 29/41741* (2013.01)

(58) Field of Classification Search
CPC ............... H01L 29/518; H01L 29/7813; H01L 29/41741; H01L 29/66727; H01L 29/41766; H01L 29/42376; H01L 29/66734; H01L 29/0649; H01L 29/66484; H01L 29/66553; H01L 29/66666
See application file for complete search history.

(56) References Cited

U.S. PATENT DOCUMENTS

| | | | |
|---|---|---|---|
| 9,947,751 B2 | 4/2018 | Kobayashi et al. | |
| 11,282,929 B2 * | 3/2022 | Fujino | H01L 29/401 |
| 2012/0241849 A1 | 9/2012 | Nozu | |
| 2014/0209999 A1 | 7/2014 | Sato et al. | |
| 2015/0137227 A1 | 5/2015 | Bobde et al. | |
| 2016/0093719 A1 | 3/2016 | Kobayashi et al. | |
| 2017/0263768 A1 | 9/2017 | Katoh et al. | |
| 2017/0345924 A1 | 11/2017 | Laforet et al. | |
| 2018/0083110 A1 | 3/2018 | Kobayashi et al. | |
| 2018/0342415 A1 | 11/2018 | Fujino et al. | |
| 2020/0273978 A1 | 8/2020 | Ohno et al. | |
| 2020/0295150 A1 | 9/2020 | Nishiwaki et al. | |

FOREIGN PATENT DOCUMENTS

| | | |
|---|---|---|
| JP | 2014-146666 A | 8/2014 |
| JP | 2015-72940 A | 4/2015 |
| JP | 6203697 B2 | 9/2017 |
| JP | 2018-046253 A | 3/2018 |
| JP | 2018-198267 A | 12/2018 |

\* cited by examiner

SEMICONDUCTOR DEVICE WITH FIELD PLATE ELECTRODE

CROSS-REFERENCE TO RELATED APPLICATION

This application is a continuation of U.S. application Ser. No. 17/004,545 filed on Aug. 27, 2020 and is based upon and claims the benefit of priority from Japanese Patent Application No. 2020-046909, filed on Mar. 17, 2020, the entire contents of which are incorporated herein by reference.

FIELD

Embodiments described herein relate generally to a semiconductor device.

BACKGROUND

A semiconductor device such as a metal oxide semiconductor field effect transistor (MOSFET) is used for power conversion and the like. Such a semiconductor device desirably has a high breakdown voltage.

DETAILED DESCRIPTION

Figure 1:
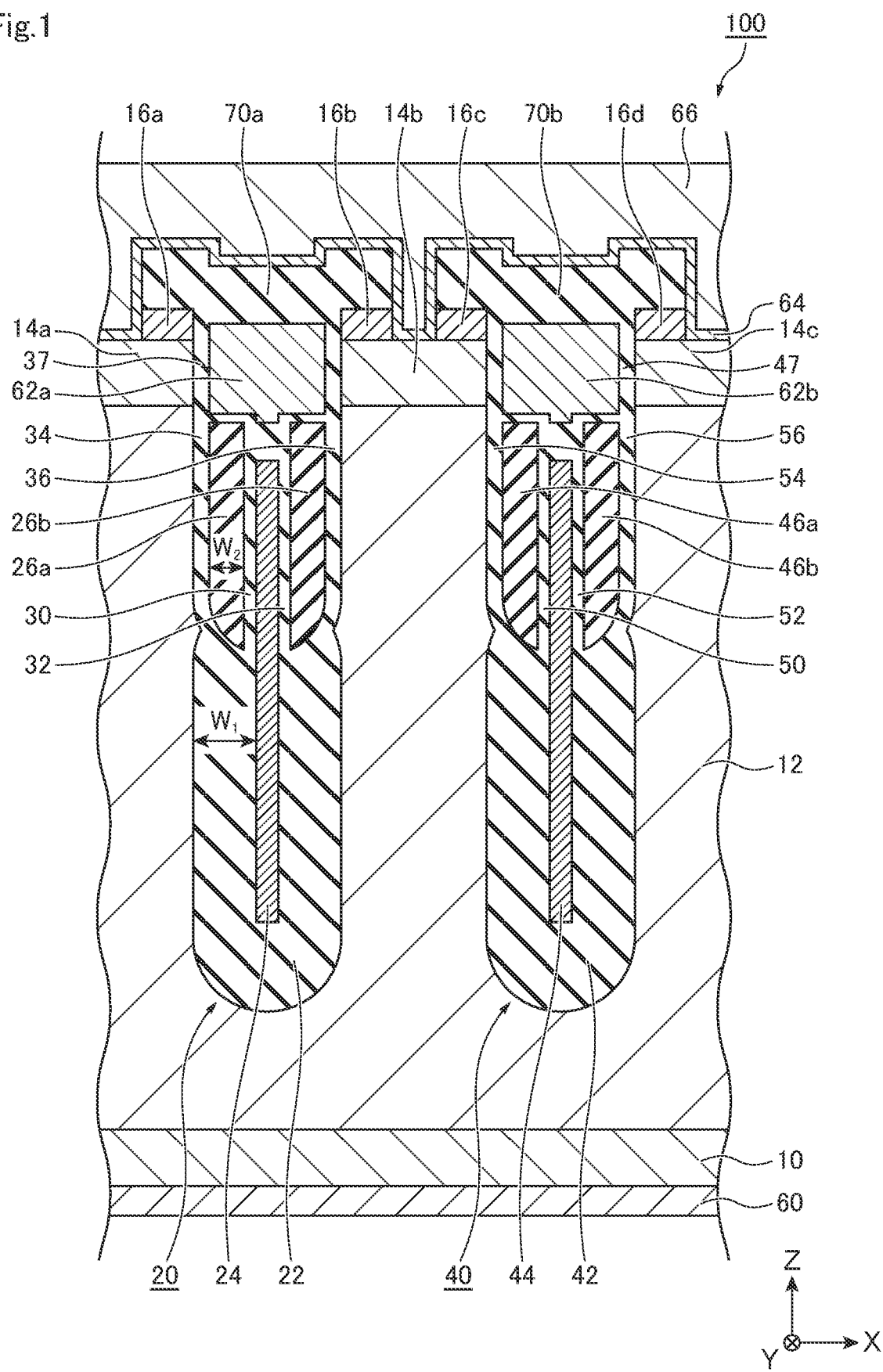
FIG. 1 is a schematic cross-sectional view of a semiconductor device according to a first embodiment.

Hereinafter, embodiments of the present disclosure will be described with reference to the drawings. Note that in the following description, the same members and the like are denoted by the same reference numerals, and description of members and the like once described is appropriately omitted.

Here, upward in the drawings is described as "up", and downward in the drawings is described as "down" in order to indicate a positional relationship of parts and the like. Here, the terms "up" and "down" do not necessarily indicate a relationship with the direction of gravity.

Hereinafter, a case where a first conductivity type is n-type and a second conductivity type is p-type will be exemplified.

In the following description, notations of $n^+$, $n$, $n^-$, $p^+$, $p$, and $p^-$ indicate a relative level of an impurity concentration of each of the conductivity types. That is, $n^+$ indicates that an impurity concentration of n-type is relatively higher than n, and $n^-$ indicates that the impurity concentration of n-type is relatively lower than n. $p^+$ indicates that an impurity concentration of p-type is relatively higher than p, and $p^-$ indicates that the impurity concentration of p-type is relatively lower than p. Note that $n^+$ type and $n^-$ type may be simply referred to as n type, and $p^+$ type and $p^-$ type may be simply referred to as p type.

First Embodiment

A semiconductor device according to the present embodiment includes: a first electrode; a first semiconductor layer of first conductivity type provided on the first electrode; a second semiconductor layer of first conductivity type provided on the first semiconductor layer; a first semiconductor region of second conductivity type provided on the second semiconductor layer; a second semiconductor region of first conductivity type provided on the first semiconductor region; a first insulating film provided in a trench reaching the second semiconductor layer from above the second semiconductor region via the second semiconductor region and the first semiconductor region, the first insulating film containing a first insulating material; a second electrode provided in the trench, the second electrode facing the second semiconductor layer via the first insulating film; a second insulating film provided between a position of 40% of a height of the second electrode from a lower end of the second electrode and a position of an upper end of the second electrode, the second insulating film being provided between the side surface of the second electrode and a fifth insulating film provided between a side surface of the second electrode and the second semiconductor layer, the fifth insulating film containing the first insulating material, the second insulating film containing a second insulating material having a higher dielectric constant than the first insulating material; a third electrode provided above the second electrode, the first insulating film and the second insulating film, the third electrode facing the first semiconductor region via a gate insulating film; an interlayer insulating film provided on the third electrode; and a fourth electrode provided above the interlayer insulating film, wherein the first insulating film in the trench below the position of 40% of the height of the second electrode contains only the first insulating material.

In addition, the semiconductor device according to the present embodiment includes: a first electrode; a first semiconductor layer of first conductivity type provided on the first electrode; a second semiconductor layer of first conductivity type provided on the first semiconductor layer; a first semiconductor region of second conductivity type provided on the second semiconductor layer; a second semiconductor region of first conductivity type provided on the first semiconductor region; a first insulating film provided in a trench reaching the second semiconductor layer from above the second semiconductor region via the second semiconductor region and the first semiconductor region, the first insulating film containing a first insulating material; a second electrode provided in the trench, the second electrode facing the second semiconductor layer via the first insulating film; a second insulating film provided between a position of 40% of a height of the second electrode from a lower end of the second electrode and a position of an upper end of the second electrode, the second insulating film being provided between the side surface of the second electrode and a fifth insulating film provided between a side surface of the second electrode and the second semiconductor layer, the fifth insulating film containing the first insulating material, the second insulating film containing a second insulating material having a higher dielectric constant than the first insulating material; a third electrode provided above the second electrode, the first insulating film and the second insulating film, the third electrode facing the first semiconductor region via a gate insulating film; an interlayer insulating film provided on the third electrode; and a fourth electrode provided above the interlayer insulating film, wherein the first insulating film in the trench below the position of 40% of the height of the second electrode does not contains the second insulating material.

Figure 2:
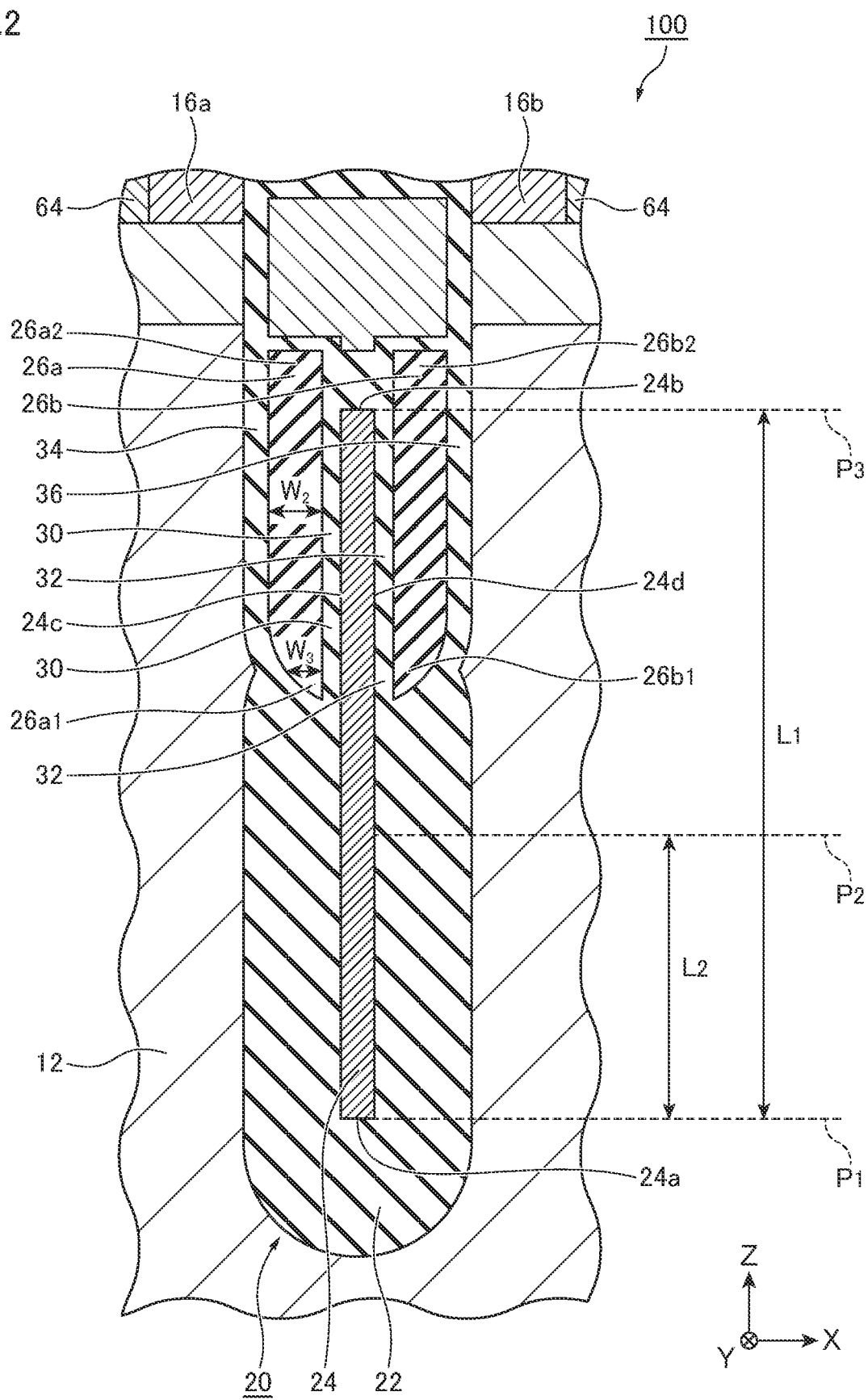
FIG. 2 is a schematic cross-sectional view of a main part of the semiconductor device according to the first embodiment.
Figure 3:
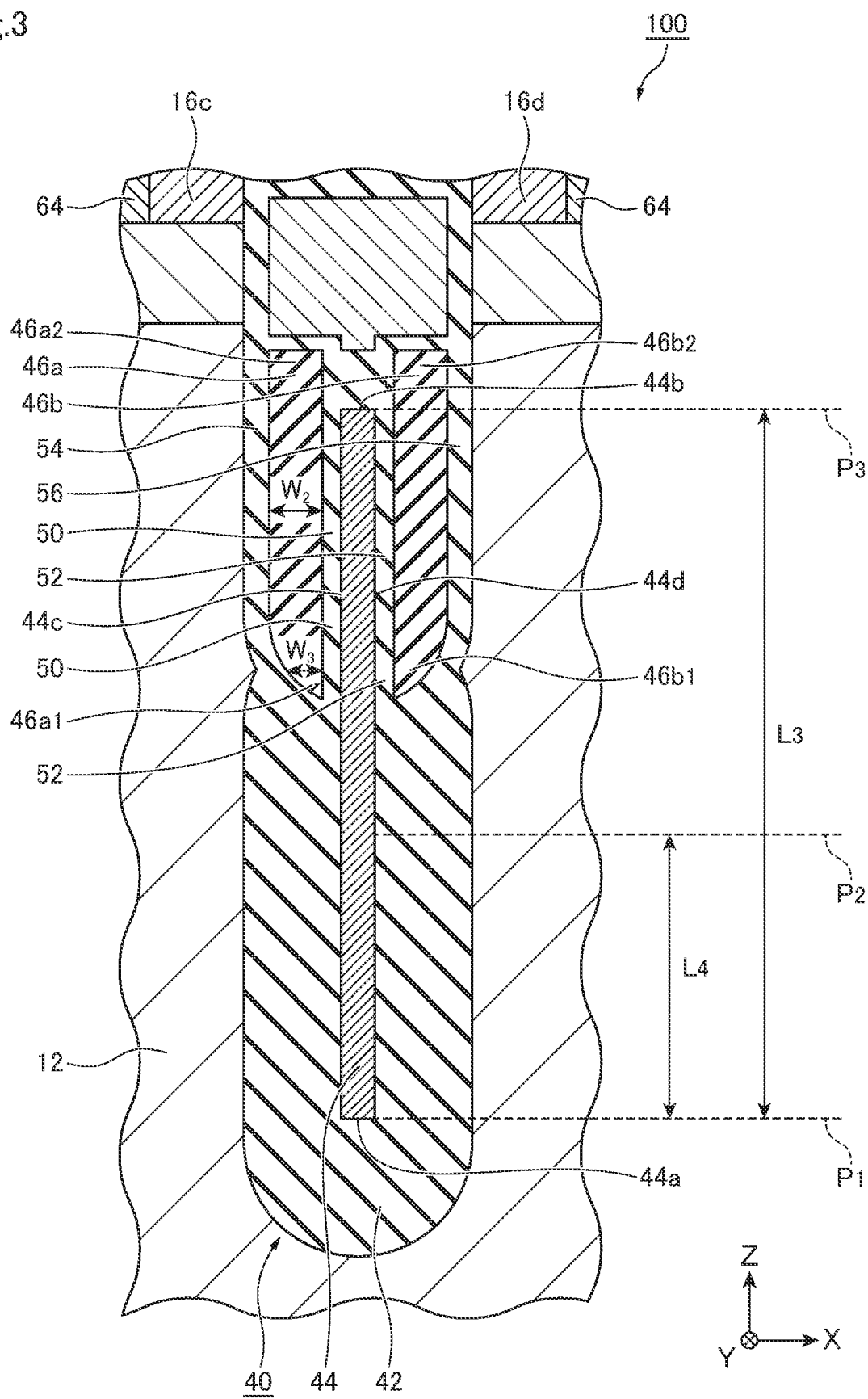
FIG. 3 is a schematic cross-sectional view of a main part of the semiconductor device according to the first embodiment.

FIG. 1 is a schematic cross-sectional view of a semiconductor device 100 according to the present embodiment. FIG. 2 is a schematic cross-sectional view of a main part of the semiconductor device 100 according to the present embodiment. FIG. 2 is a view for explaining a first trench 20. FIG. 3 is a schematic view of a main part of the semiconductor device 100 according to the present embodiment. FIG. 3 is a view for explaining a second trench 40. The semiconductor device 100 is, for example, a vertical MOSFET.

The semiconductor device 100 includes a drain layer 10, a drift layer 12, a base region 14, a source region 16, the first trench 20, a first insulating film 22, a field plate electrode 24, a second insulating film 26, a third insulating film 30, a fourth insulating film 32, a fifth insulating film 34, a sixth insulating film 36, a gate insulating film 37, the second trench 40, a seventh insulating film 42, a field plate electrode 44, an eighth insulating film 46, a gate insulating film 47, a ninth insulating film 50, a tenth insulating film 52, an eleventh insulating film 54, a twelfth insulating film 56, a drain electrode 60, a gate electrode 62, a barrier metal 64, a source electrode 66, and an interlayer insulating film 70.

Note that the drain electrode 60 is an example of the first electrode. The drain layer 10 is an example of the first semiconductor layer. The drift layer 12 is an example of the second semiconductor layer. The base region 14 is an example of the first semiconductor region. The source region 16 is an example of the second semiconductor region. The first trench 20 is an example of the trench. The field plate electrode 24 is an example of the second electrode. The gate electrode 62 is an example of the third electrode. The source electrode 66 is an example of the fourth electrode.

The drain layer 10 functions as a drain of the MOSFET. The drain layer 10 contains, for example, a semiconductor material of $n^+$ type.

The drain electrode 60 is provided under the drain layer 10 and is electrically connected to the drain layer 10. In other words, the drain layer 10 is provided on the drain electrode 60. The drain electrode 60 functions as a drain electrode of the MOSFET.

The drift layer 12 is provided on the drain layer 10. The drift layer 12 functions as a drift layer of the MOSFET. The drift layer 12 contains, for example, a semiconductor material of $n^-$ type.

The base region 14 is provided on the drift layer 12. The base region 14 functions as a base of the MOSFET. The base region 14 forms a channel and allows carriers to flow between the source region 16 and the drain layer 10 when a voltage is applied to the gate electrode 62. The base region 14 contains, for example, a p-type semiconductor material. The semiconductor device 100 includes base regions 14a, 14b, and 14c as the base region 14.

The source region 16 is provided on the base region 14. The source region 16 functions as a source of the MOSFET. When an appropriate voltage is applied to the gate electrode 62, carriers flow between the source region 16 and the drain layer 10. The source region 16 contains, for example, a semiconductor material of $n^+$ type. The semiconductor device 100 includes source regions 16a, 16b, 16c, and 16d as the source region 16.

Here, an X direction, a Y direction perpendicular to the X direction, and a Z direction perpendicular to the X direction and the Y direction are defined. The drain layer 10 and the drift layer 12 are provided parallel to an XY plane parallel to the X direction and the Y direction (horizontal direction). The Z direction is a direction in which the drain layer 10 and the drift layer 12 are stacked.

The first trench 20 is provided so as to reach the drift layer 12 from above the source region 16 via the source region 16 and the base region 14.

The first insulating film 22 is provided in the first trench 20. The first insulating film 22 contains the first insulating material. The first insulating material is, for example, silicon oxide (SiOx), but is not limited to SiOx.

The field plate electrode 24 is provided in the first trench 20 so as to face the drift layer 12 via the first insulating film 22. For example, the field plate electrode 24 is provided alongside the drift layer 12. The field plate electrode 24 is provided, for example, in order to reduce concentration of a reverse electric field between the source electrode 66 and the drain electrode 60 to increase a breakdown voltage. The field plate electrode 24 is provided so as to extend in the Z direction. The field plate electrode 24 has, for example, a portion extending upward in a portion (not illustrated) provided in the direction extending into the page of FIG. 1. The field plate electrode 24 is electrically connected to the source electrode 66 using the upwardly extending portion. Note that how to connect the field plate electrode 24 to the source electrode 66 is not limited to this connecting method.

A second insulating film 26a as the second insulating film 26 is provided in the first trench 20 between a side surface 24c of the field plate electrode and the fifth insulating film 34. The second insulating film 26a is provided between the position of 40% of the height of the field plate electrode 24 from a lower end 24a of the field plate electrode and the position of an upper end 24b of the field plate electrode. The "position of 40% of the height of the field plate electrode 24 from the lower end 24a of the field plate electrode" will be described. A distance between an XY plane $P_1$ passing through the lower end 24a of the field plate electrode and an XY plane $P_3$ passing through the upper end 24b of the field plate electrode is referred to as $L_1$. Next, consider such an XY plane $P_2$ that a distance $L_2$ from the XY plane $P_1$ passing through the lower end 24a of the field plate electrode satisfies $L_2=0.4L_1$, that is, $L_2$ is 40% of $L_1$. The position of this XY plane $P_2$ is the "position of 40% of the height of the field plate electrode 24 from the lower end 24a of the field plate electrode". In other words, the second insulating film 26a is provided between the XY plane $P_2$ and the XY plane $P_3$. Note that the second insulating film 26a may be further provided above the XY plane $P_3$. FIG. 2 illustrates a case where the second insulating film 26a is provided above the XY plane $P_3$.

Similarly, a second insulating film 26b as the second insulating film 26 is provided in the first trench 20 between a side surface 24d of the field plate electrode and the sixth insulating film 36. The second insulating film 26b is provided between the position of 40% of the height of the field plate electrode 24 from a lower end 24a of the field plate electrode and the position of an upper end 24b of the field plate electrode.

The second insulating film 26a may have a first portion $26a_1$ and a second portion $26a_2$ provided on the first portion $26a_1$. In this case, the second portion $26a_2$ has a larger film thickness than the first portion $26a_1$. Here, the film thickness is, for example, a length in a plane parallel to the XY plane (in the horizontal plane).

Similarly, the second insulating film 26b may have a third portion $26b_1$ and a fourth portion $26b_2$ provided on the third portion $26b_1$. In this case, the fourth portion $26b_2$ has a larger film thickness than the third portion $26b_1$. Here, the film thickness is, for example, a length in a plane parallel to the XY plane (in the horizontal plane).

The film thickness $W_2$ of the second insulating film 26 between the side surface 24c of the field plate electrode and the drift layer 12 is preferably 30% or more of the film thickness $W_1$ of the first insulating film 22 between the side surface 24c of the field plate electrode and the drift layer 12, where the second insulating film 26 is not provided. Here, the film thickness is, for example, a length in a plane parallel to the XY plane.

The second insulating film 26 contains the second insulating material having a higher dielectric constant than the first insulating material. The second insulating material is, for example, silicon nitride (SiNx), but is not limited to SiNx.

The third insulating film 30 is provided in the first trench 20 between the side surface 24c of the field plate electrode and the second insulating film 26a. The third insulating film 30 contains the first insulating material.

The fourth insulating film 32 is provided in the first trench 20 between the side surface 24d of the field plate electrode and the second insulating film 26b. The fourth insulating film 32 contains the first insulating material.

The fifth insulating film 34 is provided in the first trench 20 between the drift layer 12 and the second insulating film 26a. The fifth insulating film 34 contains the first insulating material.

The sixth insulating film 36 is provided in the first trench 20 between the drift layer 12 and the second insulating film 26b. The sixth insulating film 36 contains the first insulating material.

A first gate electrode 62a as the gate electrode 62 is provided above the field plate electrode 24 so as to face the base region 14 via the gate insulating film 37. The first gate electrode 62a functions as a gate of the MOSFET. The gate insulating film 37 contains, for example, the first insulating material.

For example, the first insulating film 22, the third insulating film 30, the fourth insulating film 32, the fifth insulating film 34, the sixth insulating film 36, and the gate insulating film 37 may be formed simultaneously in the same step, or may be formed in different steps.

The second trench 40 is provided so as to reach the drift layer 12 from above the source region 16 via the source region 16 and the base region 14.

The seventh insulating film 42 is provided in the second trench 40. The seventh insulating film 42 contains the first insulating material.

The field plate electrode 44 is provided in the second trench 40 so as to face the drift layer 12 via the seventh insulating film 42. For example, the field plate electrode 44 is provided alongside the drift layer 12. The field plate electrode 44 is provided, for example, in order to reduce concentration of a reverse electric field between the source electrode 66 and the drain electrode 60 to increase a breakdown voltage. The field plate electrode 44 is provided so as to extend in the Z direction. The field plate electrode 44 has, for example, a portion extending upward in a portion (not illustrated) provided in the direction extending into the page of FIG. 1. The field plate electrode 44 is electrically connected to the source electrode 66 using the upwardly extending portion. Note that how to connect the field plate electrode 44 to the source electrode 66 is not limited to this connecting method.

An eighth insulating film 46a as the eighth insulating film 46 is provided in the second trench 40 between a side surface 44c of the field plate electrode and the eleventh insulating film 54. The eighth insulating film 46a is provided between the position of 40% of the height of the field plate electrode 44 from a lower end 44a of the field plate electrode and the position of an upper end 44b of the field plate electrode. In other words, the eighth insulating film 46a is provided between the XY plane $P_2$ and the XY plane $P_3$. Note that the eighth insulating film 46a may be further provided above the XY plane $P_3$. FIG. 3 illustrates a case where the eighth insulating film 46a is provided above the XY plane $P_3$.

Similarly, an eighth insulating film 46b as the eighth insulating film 46 is provided in the second trench 40 between a side surface 44d of the field plate electrode and the twelfth insulating film 56. The eighth insulating film 46b is provided between the position of 40% of the height of the field plate electrode 44 from a lower end 44a of the field plate electrode and the position of an upper end 44b of the field plate electrode.

The ninth insulating film 50 is provided in the second trench 40 between the side surface 44c of the field plate electrode and the eighth insulating film 46a. The ninth insulating film 50 contains the first insulating material.

The tenth insulating film 52 is provided in the second trench 40 between the side surface 44d of the field plate electrode and the eighth insulating film 46b. The tenth insulating film 52 contains the first insulating material.

The eleventh insulating film 54 is provided in the second trench 40 between the drift layer 12 and the eighth insulating film 46a. The eleventh insulating film 54 contains the first insulating material.

The twelfth insulating film 56 is provided in the second trench 40 between the drift layer 12 and the eighth insulating film 46b. The twelfth insulating film 56 contains the first insulating material.

A second gate electrode 62b as the gate electrode 62 is provided above the field plate electrode 44 so as to face the base region 14 via the gate insulating film 47. The second gate electrode 62b functions as a gate of the MOSFET. The gate insulating film 47 contains, for example, the first insulating material.

For example, the seventh insulating film 42, the ninth insulating film 50, the tenth insulating film 52, the eleventh insulating film 54, the twelfth insulating film 56, and the gate insulating film 47 may be formed simultaneously in the same step, or may be formed in different steps.

An interlayer insulating film 70a as the interlayer insulating film 70 is provided on the first gate electrode 62a, the source region 16a, and the source region 16b. An interlayer insulating film 70b as the interlayer insulating film 70 is provided on the second gate electrode 62b, the source region 16c, and the source region 16d.

The source electrode 66 is provided above the base region 14, the source region 16, and the interlayer insulating film 70. The source electrode 66 functions as a source of the MOSFET.

The barrier metal 64 is provided between the source electrode 66 and the base region 14, the source region 16, and the interlayer insulating film 70. The barrier metal 64 is a film used for preventing a reaction between the source electrode 66 and a semiconductor material used for the semiconductor device 100. The barrier metal 64 contains, for example, titanium (Ti), titanium nitride (TiN), tantalum (Ta), or tantalum nitride (TaN).

Figure 4:
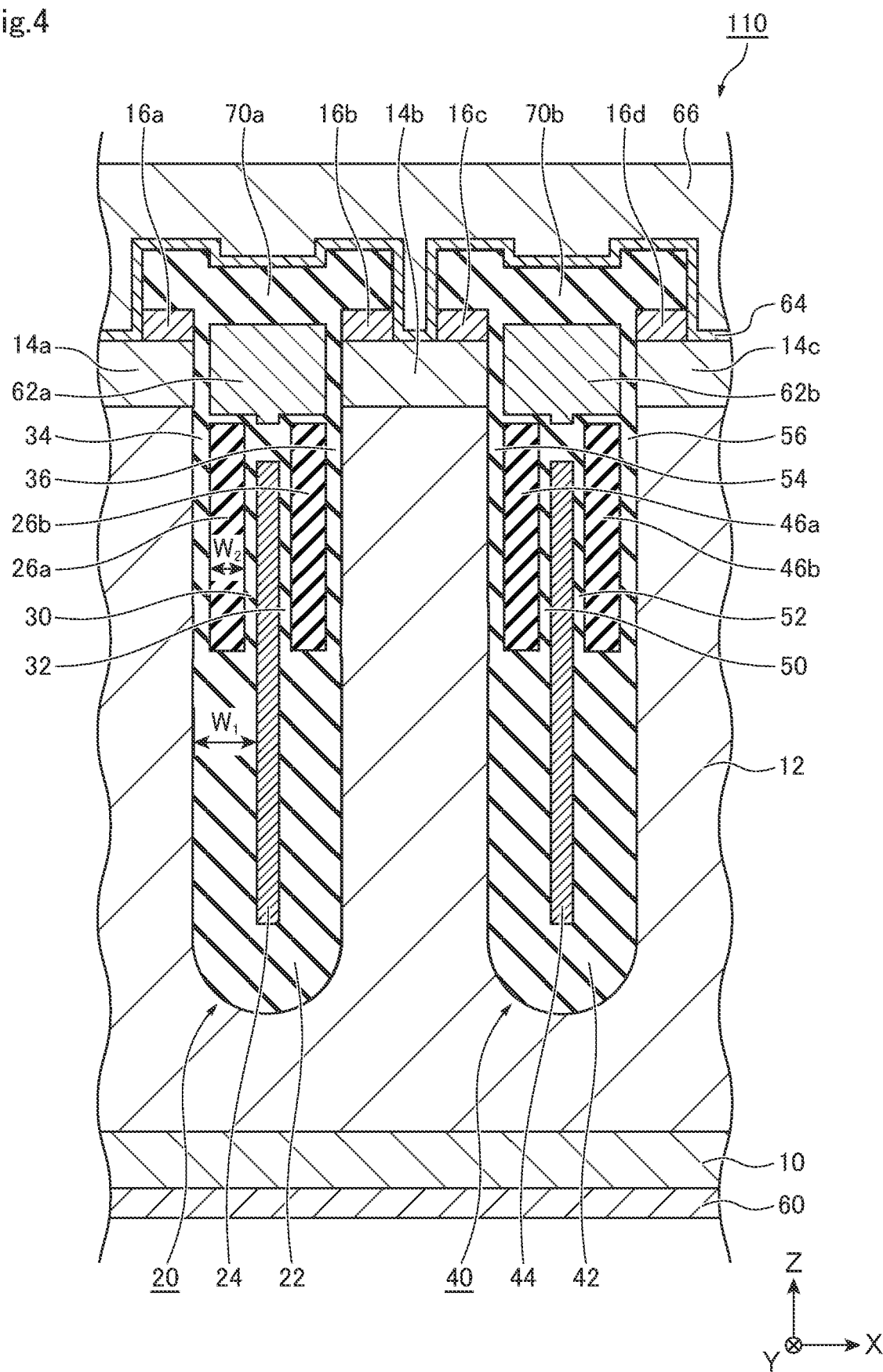
FIG. 4 is a schematic cross-sectional view of a semiconductor device according to another aspect of the first embodiment.
Figure 5:
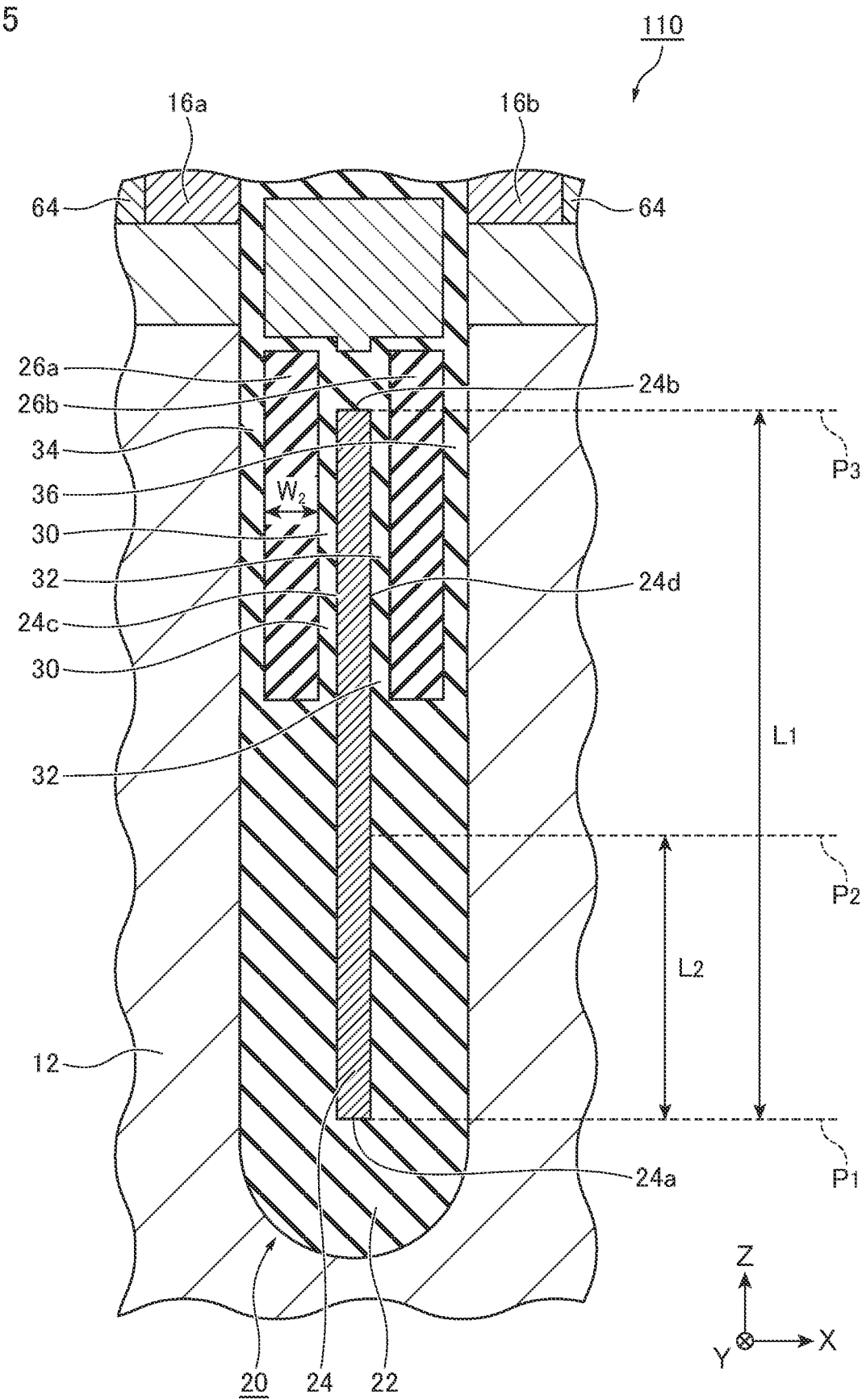
FIG. 5 is a schematic cross-sectional view of a main part of a semiconductor device according to another aspect of the first embodiment.

FIG. 4 is a schematic cross-sectional view of a semiconductor device 110 according to another aspect of the present embodiment. FIG. 5 is a schematic cross-sectional view of a main part of the semiconductor device 110 according to another aspect of the first embodiment. A difference does not have to be made in the film thickness in the up-down direction between the second insulating film 26a and the second insulating film 26b. Similarly, a difference does not have to be made in the film thickness in the up-down direction between the eighth insulating film 46a and the eighth insulating film 46b.

Examples of a semiconductor material used for the drain layer 10, the drift layer 12, the base region 14, and the source region 16 include silicon (Si). However, the semiconductor material used for the drain layer 10, the drift layer 12, the base region 14, and the source region 16 may be another semiconductor material such as silicon carbide (SiC), gallium nitride (GaN), or gallium arsenide (GaAs).

When silicon is used as the semiconductor material, for example, arsenic (As), phosphorus (P), or antimony (Sb) can be used as n-type impurities, and boron (B) can be used as p-type impurities.

The gate electrode 62, the field plate electrode 24, and the field plate electrode 44 each contain a conductive material such as polysilicon containing impurities.

The drain electrode 60 and the source electrode 66 each contain a metal such as aluminum (Al).

FIGS. 6 to 14 are schematic cross-sectional views illustrating a process of manufacturing the semiconductor device 100 according to the present embodiment.

Figure 6:
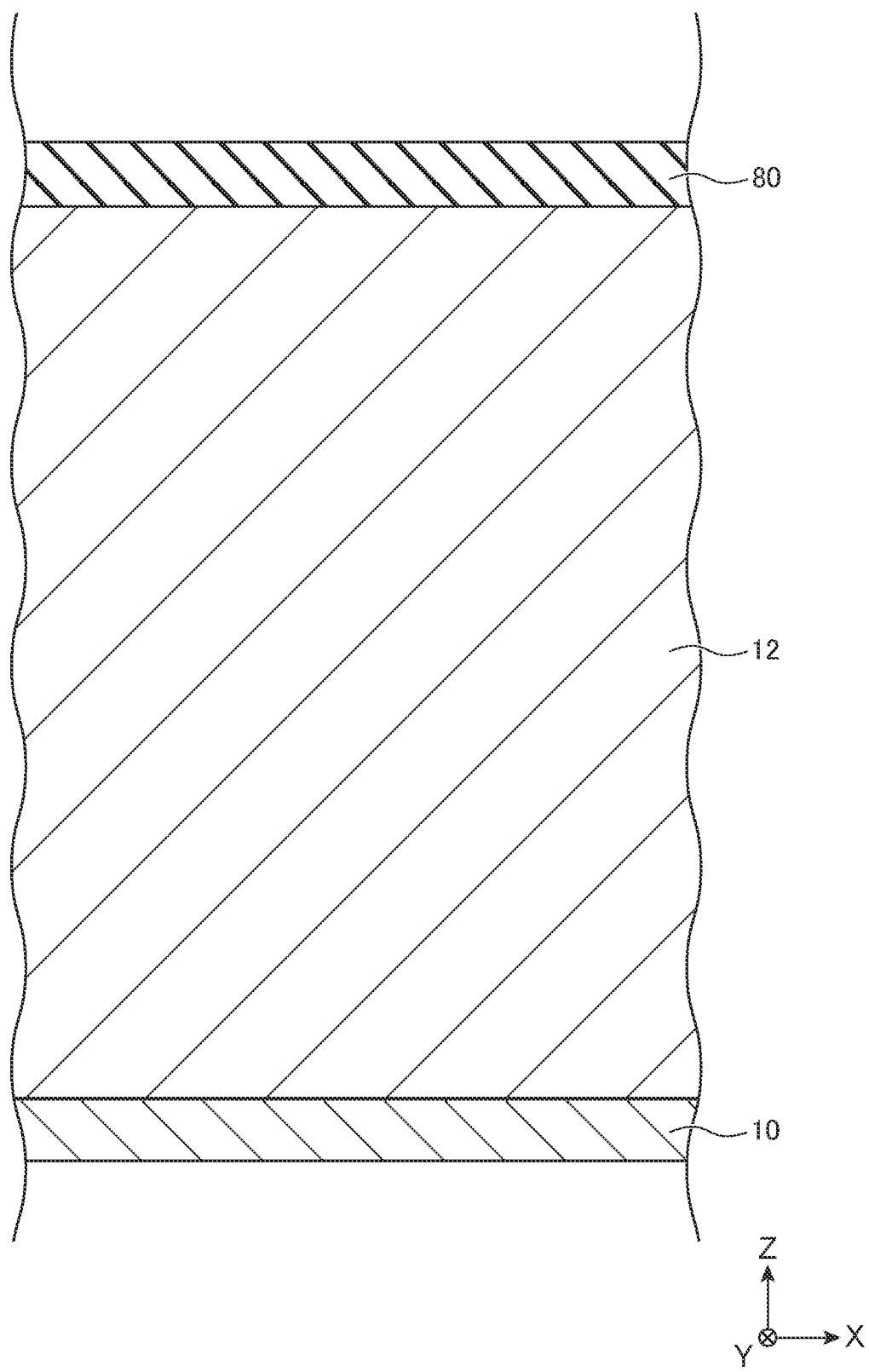
FIG. 6 is a schematic cross-sectional view illustrating a process of manufacturing the semiconductor device according to the first embodiment.
Figure 7:
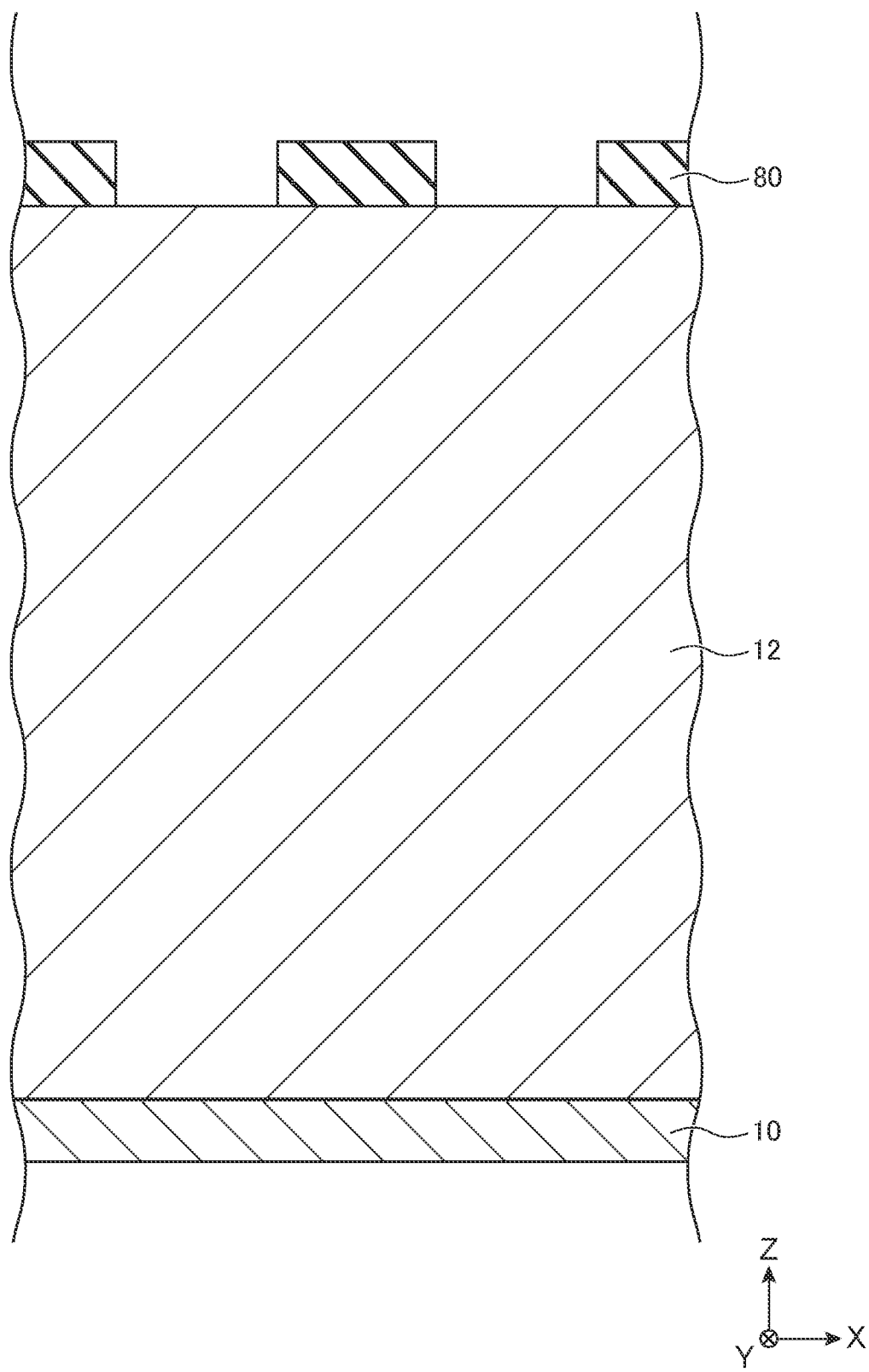
FIG. 7 is a schematic cross-sectional view illustrating the process of manufacturing the semiconductor device according to the first embodiment.
Figure 8:
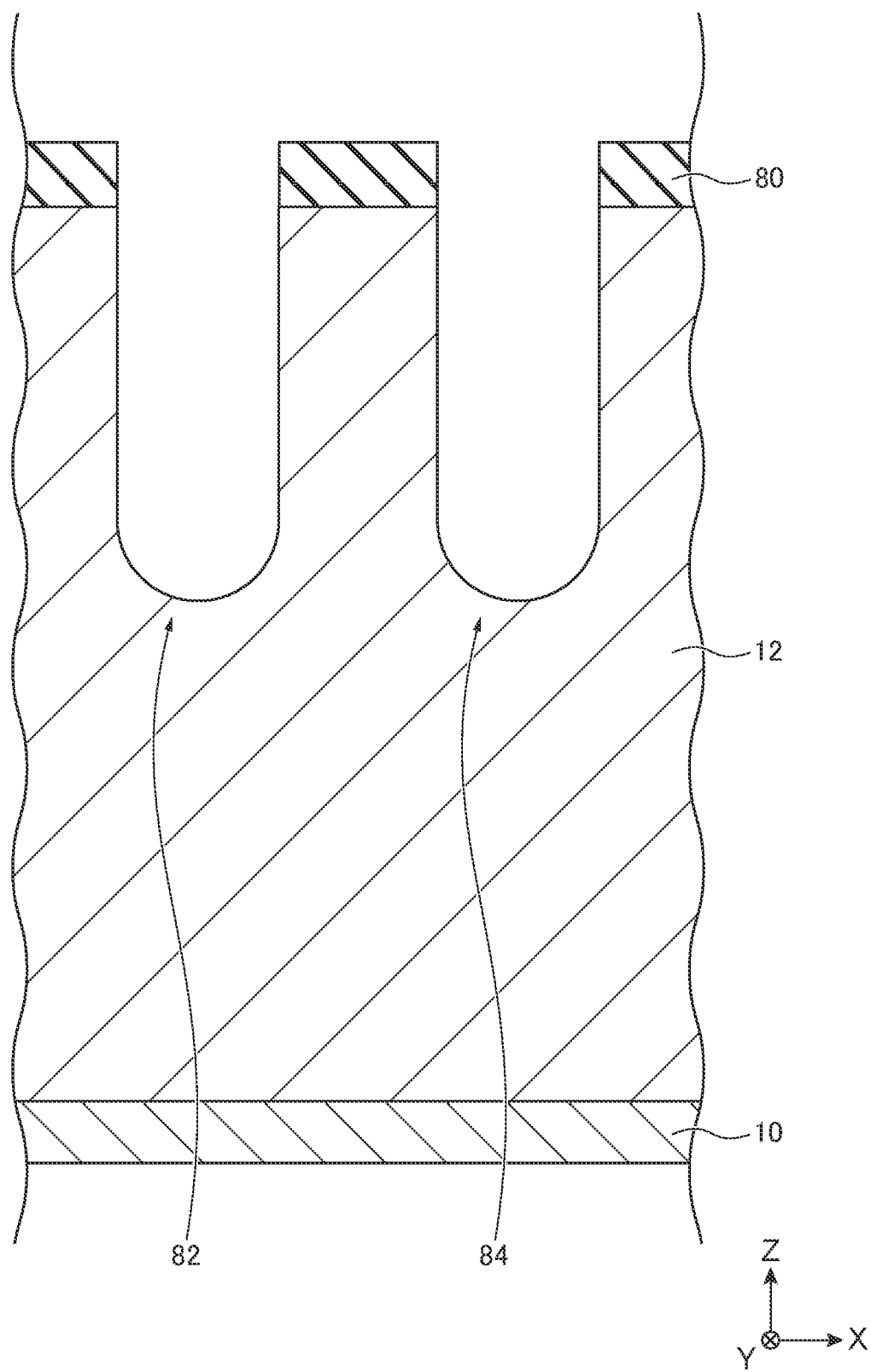
FIG. 8 is a schematic cross-sectional view illustrating the process of manufacturing the semiconductor device according to the first embodiment.
Figure 9:
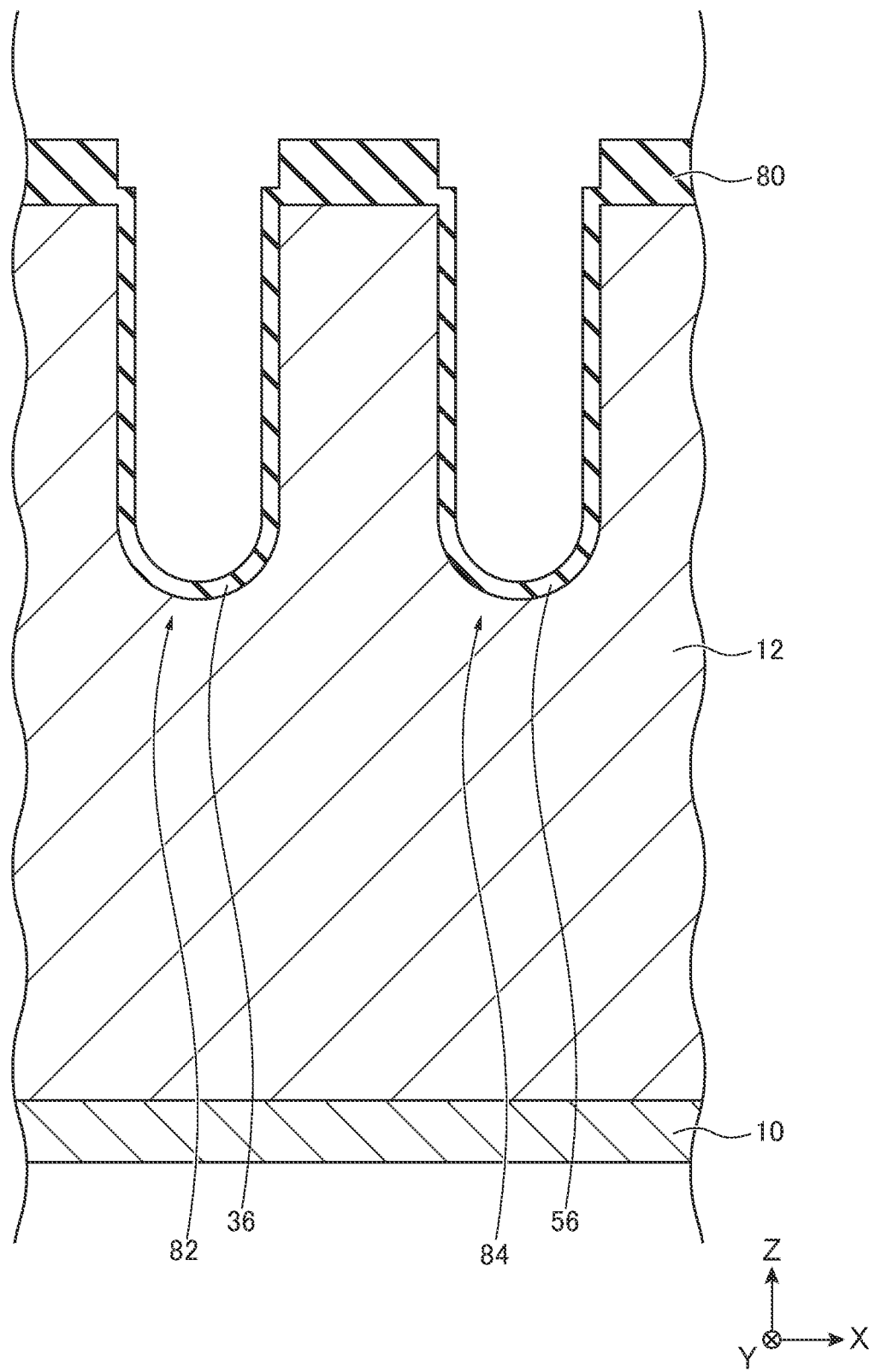
FIG. 9 is a schematic cross-sectional view illustrating the process of manufacturing the semiconductor device according to the first embodiment.
Figure 10:
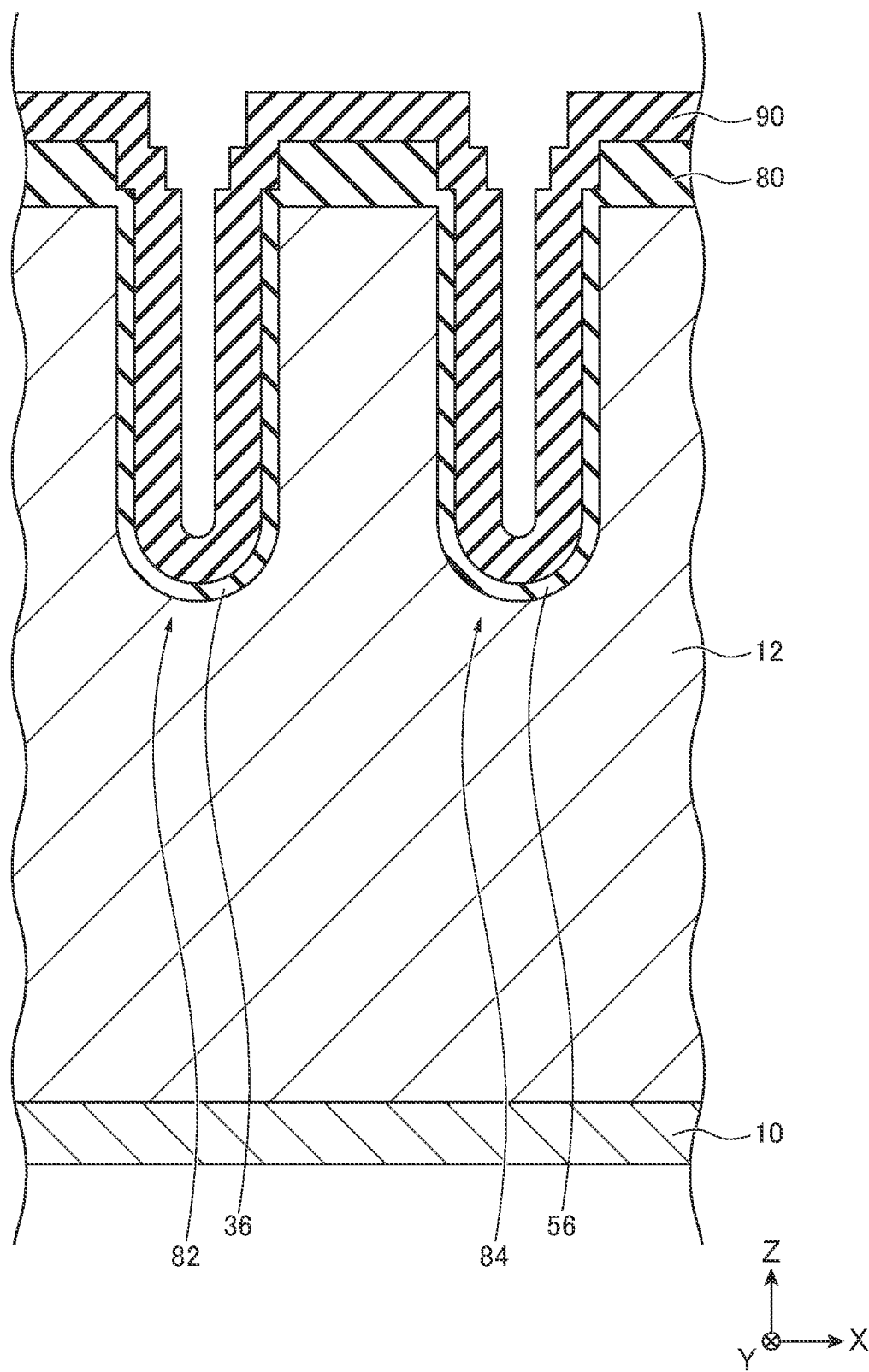
FIG. 10 is a schematic cross-sectional view illustrating the process of manufacturing the semiconductor device according to the first embodiment.

First, the drift layer 12 and the base region 14 are formed on the drain layer 10. For example, the drain layer 10 is used as a semiconductor substrate which is a Si substrate, and the drift layer 12 is formed on the drain layer 10 by epitaxial growth. However, the process of manufacturing the drain layer 10 and the drift layer 12 is not limited to the above manufacturing process. Next, the insulating film 80 containing the first insulating material which is, for example, silicon oxide is formed on the drift layer 12 by, for example, a thermal oxidation method or chemical vapor deposition (CVD) (FIG. 6). Next, a part of the insulating film 80 is removed by, for example, photolithography and reactive ion etching (RIE) (FIG. 7). Next, using the insulating film 80 as a mask, trenches 82 and 84 reaching the drift layer 12 from above the source region 16 are formed (FIG. 8). Next, the sixth insulating film 36 and the twelfth insulating film 56 each containing the first insulating material which is, for example, silicon oxide are formed in the trench 82 and the trench 84 on the drift layer 12 by a thermal oxidation method or CVD, respectively (FIG. 9). Next, an insulating film 90 containing the second insulating material which is, for example, silicon nitride is formed on the sixth insulating film 36 and the twelfth insulating film 56 by, for example, low pressure chemical vapor deposition (LPCVD) (FIG. 10).

Figure 11:
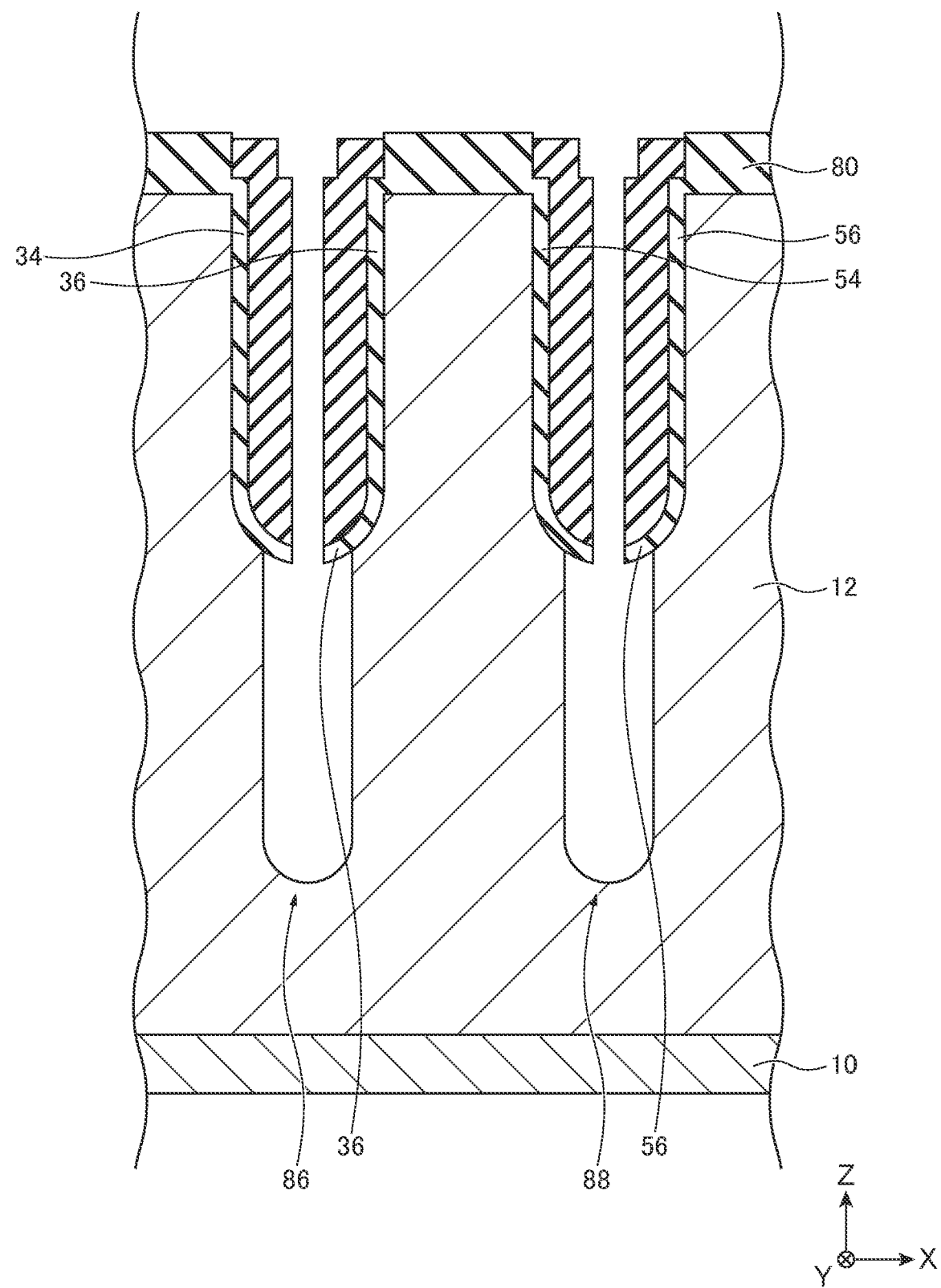
FIG. 11 is a schematic cross-sectional view illustrating the process of manufacturing the semiconductor device according to the first embodiment.

Next, a part of the insulating film 90 formed on the sixth insulating film 36 and the twelfth insulating film 56, a part of the sixth insulating film 36, and a part of the twelfth insulating film 56 at a bottom of the trench 82 and a bottom of the trench 84 are removed by, for example, photolithography and RIE. Next, trenches 86 and 88 extending below the trenches 82 and 84 are formed by, for example, RIE which is anisotropic etching and chemical dry etching (CDE) which is isotropic etching. By removing the part of the sixth insulating film 36 in the trench 82, the sixth insulating film 36 becomes the fifth insulating film 34 and the sixth insulating film 36. By removing the part of the twelfth insulating film 56 in the trench 84, the twelfth insulating film 56 becomes the eleventh insulating film 54 and the twelfth insulating film 56 (FIG. 11).

Figure 12:
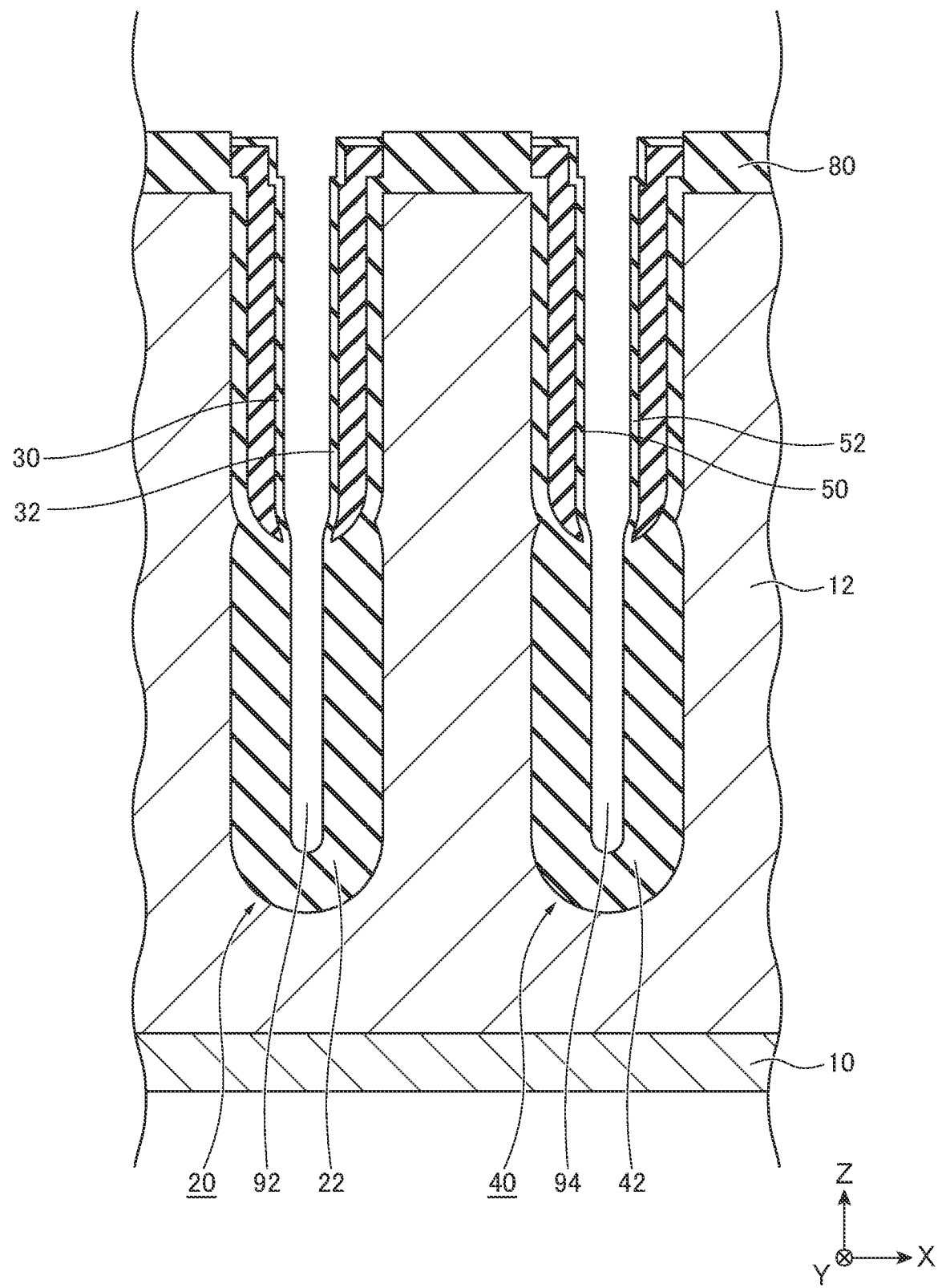
FIG. 12 is a schematic cross-sectional view illustrating the process of manufacturing the semiconductor device according to the first embodiment.

Next, an inner wall of the trench 86 and an inner wall of the trench 88 below the insulating film 90 are thermally oxidized by, for example, local oxidation of silicon (LOCOS). This forms the first trench 20 having the first insulating film 22 containing the first insulating material which is silicon oxide provided inside and the second trench 40 having the seventh insulating film 42 containing the first insulating material which is silicon oxide provided inside. Note that, for example, the third insulating film 30, the fourth insulating film 32, the ninth insulating film 50, and the tenth insulating film 52 each containing the first insulating material are also formed around the insulating film 90. However, the oxidation rate of silicon nitride is lower than that of Si. Therefore, the third insulating film 30 and the fourth insulating film 32 each have a smaller film thickness than the first insulating film 22, and the ninth insulating film 50 and the tenth insulating film 52 each have a smaller film thickness than the seventh insulating film 42. Holes 92 and 94 are left inside and above the first insulating film 22 and inside and above the seventh insulating film 42 (FIG. 12). The third insulating film 30 and the fourth insulating film 32, the ninth insulating film 50 and the tenth insulating film 52, and the first insulating film 22 and the seventh insulating film 42 may be formed only by the LOCOS. After the LOCOS is performed, a film containing the first insulating material may be additionally stacked by, for example, the CVD method.

Figure 13:
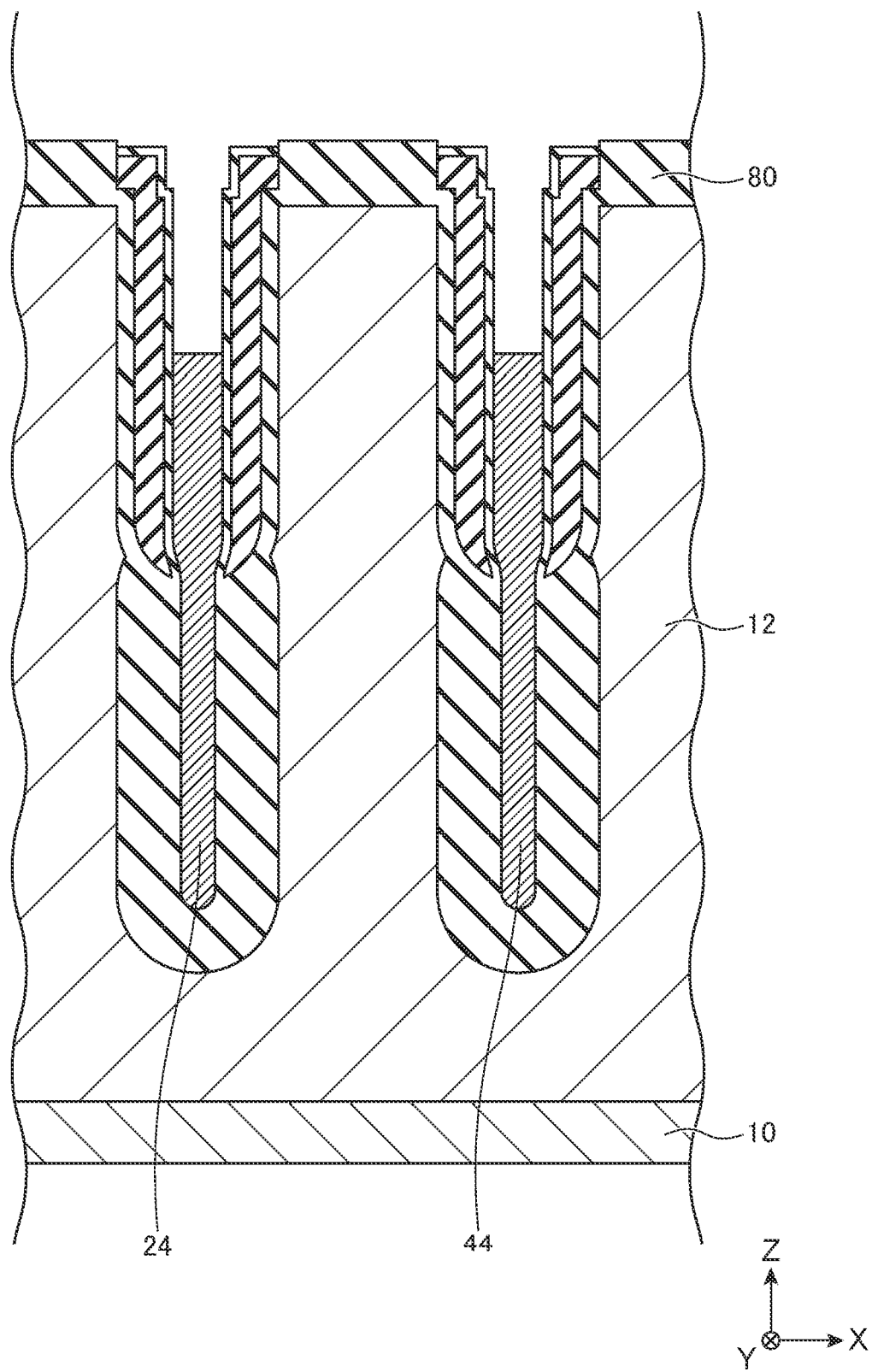
FIG. 13 is a schematic cross-sectional view illustrating the process of manufacturing the semiconductor device according to the first embodiment.

Next, the field plate electrode 24 and the field plate electrode 44 each containing polysilicon containing impurities are formed inside the hole 92 and inside the hole 94, respectively, for example, by CVD (FIG. 13).

Figure 14:
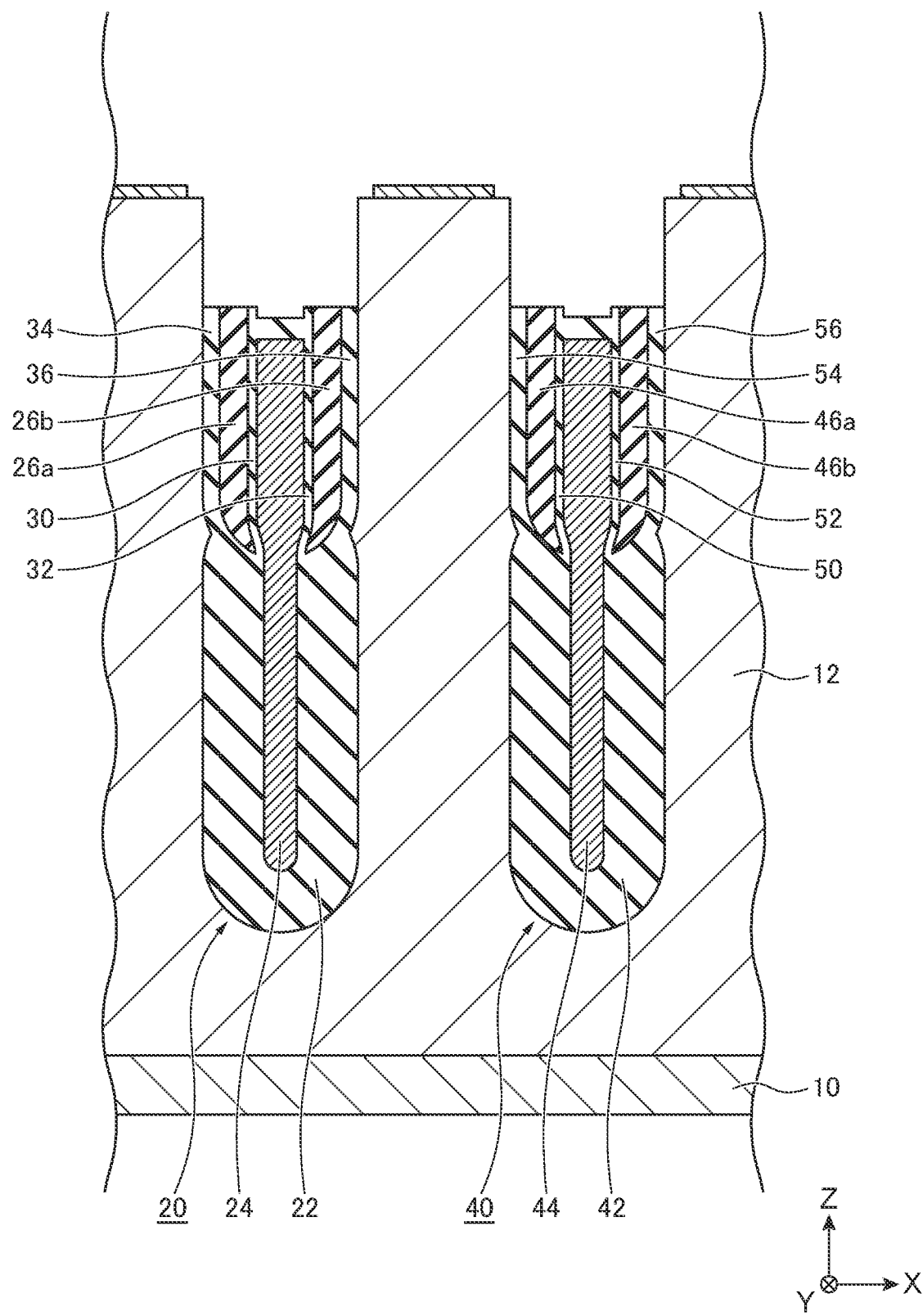
FIG. 14 is a schematic cross-sectional view illustrating the process of manufacturing the semiconductor device according to the first embodiment.

Next, a part of each of the third insulating film 30, the fourth insulating film 32, the insulating film 90, and the insulating film 80 provided above the field plate electrode 24 and the field plate electrode 44 is removed by etching and CDE. The insulating film 90 in the first trench 20 becomes the second insulating film 26a and the second insulating film 26b which are the second insulating films 26. The insulating film 90 in the second trench 40 becomes the eighth insulating film 46a and the eighth insulating film 46b which are the eighth insulating films 46. The insulating film 80 between the drift layer 12 and the second insulating film 26a becomes the fifth insulating film 34. The insulating film 80 between the drift layer 12 and the second insulating film 26b becomes the sixth insulating film 36. The insulating film 80 between the drift layer 12 and the eighth insulating film 46a becomes the eleventh insulating film 54. The insulating film 80 between the drift layer 12 and the eighth insulating film 46b becomes the twelfth insulating film 56 (FIG. 14).

Next, the gate electrode 62, the base region 14, the source region 16, the gate insulating film 37, the gate insulating film 47, the interlayer insulating film 70, the barrier metal 64, the source electrode 66, and the drain electrode 60 are formed to obtain the semiconductor device 100 according to the present embodiment.

Next, a function and an effect of the present embodiment will be described.

In the MOSFET having an up-down electrode structure as in the present embodiment, the impurity concentration and the film thickness of the drift layer 12 are adjusted within a predetermined range in order to maintain an element breakdown voltage during switching off. The impurity concentration and the film thickness of the drift layer 12 are limited by a physical property limit of a semiconductor material forming the drift layer 12. Therefore, there is a trade-off relationship between an element breakdown voltage and an on-resistance.

There is a MOSFET in which the field plate electrode 24 electrically connected to the source electrode 66 or the gate electrode 62 is provided below the trench-type gate electrode 62. By providing the field plate electrode 24 below the gate electrode 62, a depletion layer spreads between the trenches when a voltage is applied to the drain electrode 60. This makes it possible to increase the impurity concentration of the drift layer 12 without a decrease in the element breakdown voltage. As a result, an on-resistance can be decreased in the MOSFET including the field plate electrode 24.

Meanwhile, in the MOSFET including the field plate electrode 24, for example, in a case where a breakdown voltage of 200 V or more is required, when it is tried to deepen a trench and to increase the film thickness of an insulating film formed in the trench in order to obtain a desired breakdown voltage, a semiconductor substrate (wafer) on which the MOSFET is formed may be excessively stressed, and the wafer may be warped, which makes manufacturing difficult disadvantageously. When the depth of a trench and the film thickness of an insulating film formed in the trench are suppressed, and instead, the n-type impurity concentration of a part of the drift layer 12 is lowered to increase a breakdown voltage in order to avoid this problem, an on-resistance increases disadvantageously. In a case where a so-called super junction structure is used, in a p-type impurity-containing layer and an n-type impurity-containing layer provided alternately, it is more difficult to control the p-type impurity content and the n-type impurity content as the impurity concentrations of the p-type impurity-containing layer and the n-type impurity-containing layer increase. Therefore, an on-resistance is high in a specific breakdown voltage region disadvantageously as compared with the MOSFET including the field plate electrode 24 because it is difficult to increase the impurity concentration.

Figure 15C:
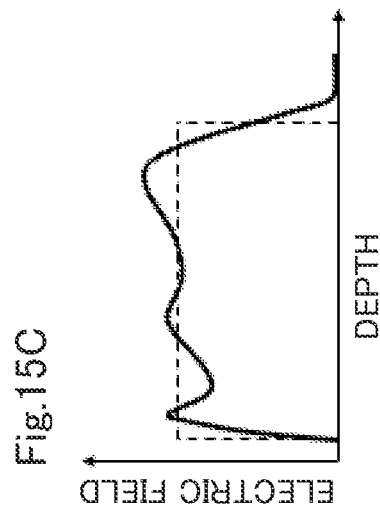
FIGS. 15A to 15C are schematic diagrams illustrating a function and an effect of the semiconductor device according to the first embodiment.
Figure 15B:
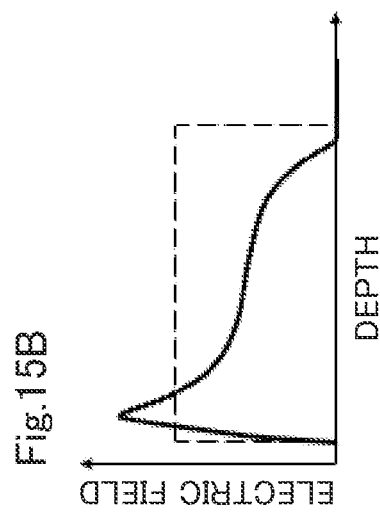
Figure 15A:
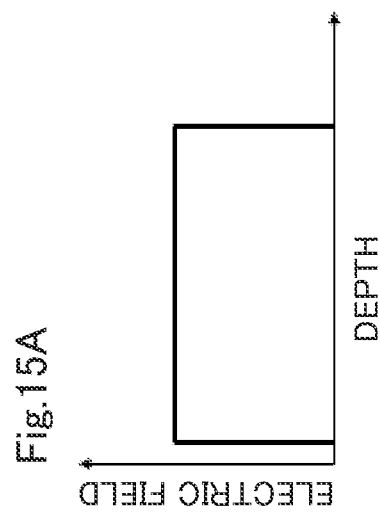

FIGS. 15A to 15C are schematic diagrams for explaining a function and an effect of the semiconductor device 100 according to the present embodiment. FIGS. 15A to 15C are schematic diagrams illustrating an electric field distribution in a depth direction of the semiconductor device. FIG. 15A illustrates an ideal rectangular electric field distribution. FIG. 15B is a schematic diagram when an insulating film in a trench has a uniform film thickness. In this case, since the electric field distribution in the depth direction of the semiconductor device is non-uniform, a breakdown voltage decreases.

The semiconductor device 100 according to the present embodiment includes the second insulating film 26 provided between the position of 40% of the height of the field plate electrode 24 from the lower end 24a of the field plate electrode and the position of the upper end 24b of the field plate electrode between the side surface 24c of the field plate electrode and the first insulating film 22, the second insulating film 26 containing the second insulating material having a higher dielectric constant than the first insulating material.

For example, an electric field distribution in the depth direction of the semiconductor device 100 according to the present embodiment is schematically illustrated as in FIG. 15C. This makes it possible to make the effective film thickness of an insulating film in an upper portion of the first trench 20 smaller than the effective film thickness of the insulating film in a lower portion of the first trench 20. This makes it possible to make the electric field distribution in the semiconductor device 100 closer to a rectangular shape when a reverse voltage is applied. Therefore, a semiconductor device having a high breakdown voltage can be provided. In addition, it is not necessary to separately provide a layer having a lower n-type impurity concentration at a bottom of the drift layer 12. Therefore, it is possible to provide a semiconductor device having a high breakdown voltage while an increase in on-resistance is suppressed.

In the semiconductor device 100 according to the present embodiment, the first insulating film 22 in the first trench 20 below the position of 40% of the height of the field plate electrode 24 contains only the first insulating material. In other words, the first insulating film 22 in the first trench 20 below the position of 40% of the height of the field plate electrode 24 does not contain the second insulating material.

When a reverse electric field is applied to the semiconductor device 100, a high voltage is applied to the drain electrode 60. Meanwhile, since the field plate electrode 24 is often connected to the source electrode 66 to be used as the same potential as the source electrode 66, a voltage applied to the field plate electrode 24 is, for example, 0 volt. In this case, since a high electric field is easily applied to a bottom of the first trench 20, the bottom of the first trench 20 is easily broken. When the second insulating material having a higher dielectric constant than the first insulating material is used for the bottom of the first trench 20 and the vicinity of the bottom of the first trench 20, the effective film thickness of an insulating film at the bottom of the first trench 20 is smaller. Therefore, the bottom of the first trench 20 is more easily broken. Therefore, in the semiconductor device 100 according to the present embodiment, the first insulating film 22 in the first trench 20 below the position of 40% of the height of the field plate electrode 24 contains only the first insulating material, or does not contain the second insulating material.

By further providing the third insulating film 30 provided between the side surface 24c of the field plate electrode and the second insulating film 26a, a distance between the field plate electrode 24 and the second insulating film 26 can be controlled using the film thickness of the third insulating film 30. Therefore, the entire insulating film thickness can be controlled independently of control of a difference in the effective film thickness of the insulating film between the upper portion and lower portion in the first trench 20, and a breakdown voltage can be easily controlled.

The second insulating film 26 has the first portion $26a_1$ and the second portion $26a_2$ provided on the first portion $26a_1$, the second portion $26a_2$ having a larger film thickness than the first portion $26a_1$. This makes the effective film thickness of the insulating film in the first trench 20 different between the vicinity of the first portion $26a_1$ and the vicinity of the second portion $26a_2$. By using this, it is possible to control the electric field distribution so as to be closer to a rectangular shape when a reverse electric field is applied.

The film thickness $W_2$ of the second insulating film 26 between the side surface 24c of the field plate electrode and the drift layer 12 is preferably 30% or more of the film thickness $W_1$ of the first insulating film 22 between the side surface 24c of the field plate electrode and the drift layer 12, where the second insulating film 26 is not provided. This is because when the film thickness $W_2$ of the second insulating film 26 is less than 30% of the film thickness $W_1$ of the first insulating film 22, the film thickness $W_2$ is too small, and an effect of providing the second insulating film 26 cannot be sufficiently expected.

When silicon oxide is used as the first insulating material and silicon nitride is used as the second insulating material, the silicon oxide has a compressive stress and the silicon nitride has a tensile stress. Therefore, the stresses cancel each other out. Therefore, it is possible to suppress a disadvantage that a semiconductor substrate (wafer) is excessively stressed to be warped.

The semiconductor device 100 according to the present embodiment can provide a semiconductor device having a high breakdown voltage.

Second Embodiment

A semiconductor device 120 according to the present embodiment is different from the first embodiment in that a field plate electrode 24 has a third portion 24e and a fourth portion 24f provided on the third portion 24e, the fourth portion 24f having a larger film thickness than the third portion 24e. Here, description of contents overlapping with those of the first embodiment is omitted.

Figure 16:
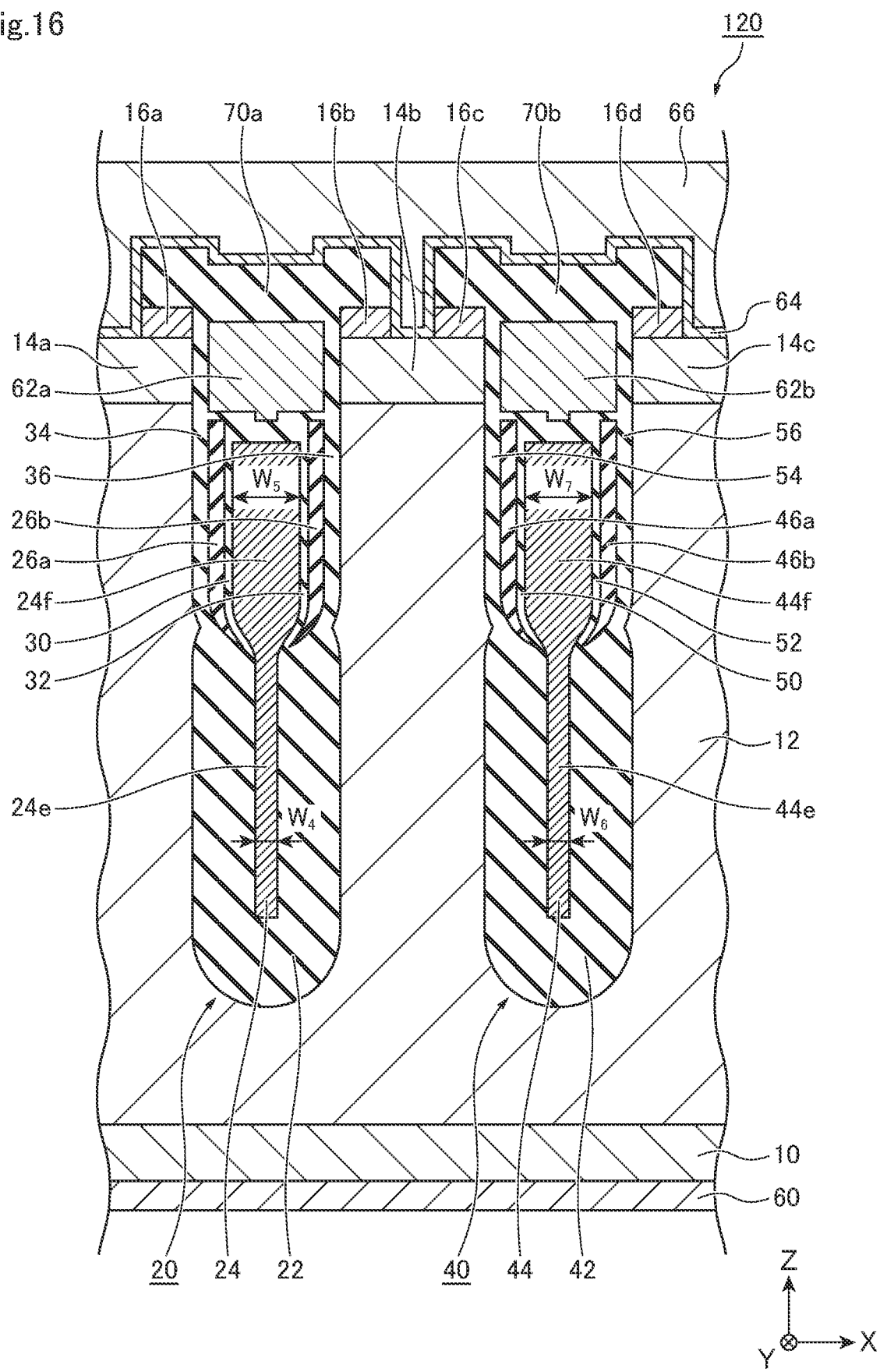
FIG. 16 is a schematic cross-sectional view of a main part of a semiconductor device according to a second embodiment.

FIG. 16 is a schematic cross-sectional view of a main part of the semiconductor device 120 according to the present embodiment. The field plate electrode 24 has the third portion 24e and the fourth portion 24f provided on the third portion 24e. The film thickness $W_5$ of the fourth portion 24f is larger than the film thickness $W_4$ of the third portion 24e. Here, the film thickness is, for example, a length in the XY plane.

The field plate electrode 44 has a portion 44e and a portion 44f provided on the portion 44e. The film thickness $W_7$ of the portion 44f is larger than the film thickness $W_6$ of the portion 44e. Here, the film thickness is, for example, a length in the XY plane.

Since the field plate electrode 24 and the field plate electrode 44 each have portions having different film thicknesses, it is possible to provide a semiconductor device having a higher breakdown voltage.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a first semiconductor layer of first conductivity type provided on the first electrode;
a first semiconductor region of second conductivity type provided on the first semiconductor layer;
a second semiconductor region of first conductivity type provided on the first semiconductor region;
a first insulating film provided in a trench reaching the first semiconductor layer from above the second semiconductor region via the second semiconductor region and the first semiconductor region, the first insulating film containing a first insulating material;
a second electrode provided in the trench, the second electrode facing the first semiconductor layer via the first insulating film;
a second insulating film provided between the second electrode and a fifth insulating film provided between the second electrode and the first semiconductor layer, the fifth insulating film containing the first insulating material, the second insulating film containing a second insulating material having a higher dielectric constant than the first insulating material;
a third electrode provided above the second electrode and the first insulating film, the third electrode facing the first semiconductor region via a gate insulating film;
an interlayer insulating film provided on the third electrode; and
a fourth electrode provided above the interlayer insulating film, wherein
the second insulating film is not provided at least at a part of the bottom of the trench, and wherein
a distance between an upper end of the second insulating film and the first electrode is longer than a distance between an upper end of the second electrode and the first electrode.

2. The semiconductor device according to claim 1, wherein a film thickness of the second insulating film between a side surface of the second electrode and the first semiconductor layer is 30% or more of a film thickness of the first insulating film where the second insulating film is not provided, and the first insulating film is provided between the side surface of the second electrode and the first semiconductor layer.

3. The semiconductor device according to claim 1, further comprising a third insulating film provided between a side surface of the second electrode and the second insulating film, the third insulating film containing the first insulating material.

4. The semiconductor device according to claim 1, wherein the second insulating film has a first portion and a second portion provided on the first portion, the second portion having a larger film thickness than the first portion in a horizontal direction.

5. The semiconductor device according to claim 1, wherein the second electrode has a third portion and a fourth portion provided on the third portion, the fourth portion having a larger film thickness than the third portion in a horizontal direction.

6. The semiconductor device according to claim 1, wherein the first insulating material is silicon oxide, and the second insulating material is silicon nitride.

7. The semiconductor device according to claim 1, further comprising a second semiconductor layer of first conductivity type provided between the first electrode and the first semiconductor layer.

8. The semiconductor device according to claim 1, wherein the second insulating film is provided between a side surface of the second electrode and the fifth insulating film provided between the side surface of the second electrode and the first semiconductor layer.

9. The semiconductor device according to claim 1, wherein a distance between a lower end of the second insulating film and the first electrode is longer than a distance between a lower end of the second electrode and the first electrode.

10. A semiconductor device comprising:
a first electrode;
a first semiconductor layer of first conductivity type provided on the first electrode;
a first semiconductor region of second conductivity type provided on the first semiconductor layer;
a second semiconductor region of first conductivity type provided on the first semiconductor region;
a first insulating film provided in a trench reaching the first semiconductor layer from above the second semiconductor region via the second semiconductor region and the first semiconductor region, the first insulating film containing a first insulating material;
a second electrode provided in the trench, the second electrode facing the first semiconductor layer via the first insulating film;
a second insulating film provided between the second electrode and a fifth insulating film provided between the second electrode and the first semiconductor layer, the fifth insulating film containing the first insulating material, the second insulating film containing a second insulating material having a higher dielectric constant than the first insulating material;
a third electrode provided above the second electrode and the first insulating film, the third electrode facing the first semiconductor region via a gate insulating film;
an interlayer insulating film provided on the third electrode;
a fourth electrode provided above the interlayer insulating film; and
a fourth insulating film provided between the second electrode and the third electrode, wherein
the second insulating film is not provided at least at a part of the bottom of the trench, and wherein
the second insulating film includes a first insulating portion and a second insulating portion, and wherein
the fourth insulating film is provided between the first insulating portion and the second insulating portion.

11. The semiconductor device according to claim 10, wherein a film thickness of the second insulating film between a side surface of the second electrode and the first semiconductor layer is 30% or more of a film thickness of the first insulating film where the second insulating film is not provided, and the first insulating film is provided between the side surface of the second electrode and the first semiconductor layer.

12. The semiconductor device according to claim 10, further comprising a third insulating film provided between a side surface of the second electrode and the second insulating film, the third insulating film containing the first insulating material.

13. The semiconductor device according to claim 10, wherein the second insulating film has a first portion and a second portion provided on the first portion, the second portion having a larger film thickness than the first portion in a horizontal direction.

14. The semiconductor device according to claim 10, wherein the second electrode has a third portion and a fourth portion provided on the third portion, the fourth portion having a larger film thickness than the third portion in a horizontal direction.

15. The semiconductor device according to claim 10, wherein the first insulating material is silicon oxide, and the second insulating material is silicon nitride.

16. The semiconductor device according to claim 10, further comprising a second semiconductor layer of first conductivity type provided between the first electrode and the first semiconductor layer.

17. The semiconductor device according to claim 10, wherein the second insulating film is not provided at least a part between a lower part of the side surface of the second electrode and the fifth insulating film.

18. The semiconductor device according to claim 10, wherein the second insulating film is provided between a side surface of the second electrode and the fifth insulating film provided between the side surface of the second electrode and the first semiconductor layer.

19. The semiconductor device according to claim 10, wherein a distance between a lower end of the second insulating film and the first electrode is longer than a distance between a lower end of the second electrode and the first electrode.

20. The semiconductor device according to claim 10, wherein a lower end of the first insulating portion and a lower end of the second insulating portion are provided separately from each other.

* * * * *